Dec. 3, 1968 W. E. NEWELL 3,414,832
ACOUSTICALLY RESONANT DEVICE
Filed Dec. 4, 1964
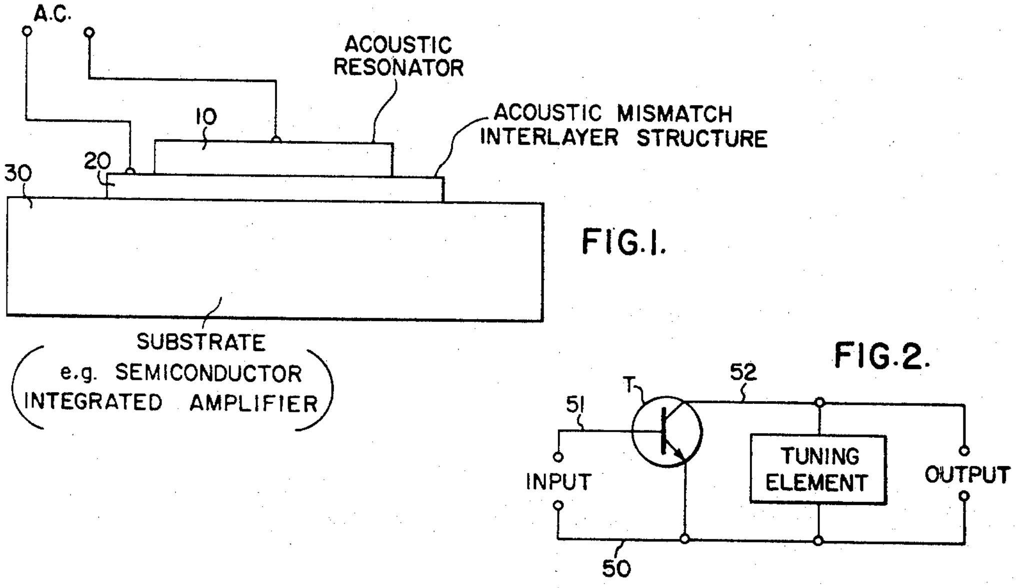
FIG. 1. FIG. 2.
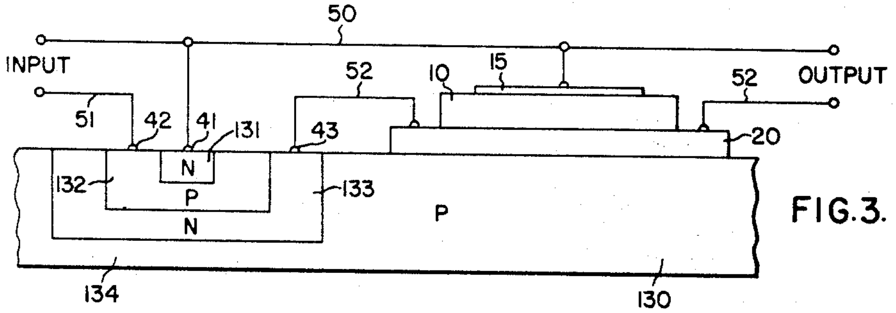
FIG. 3.
FIG. 4.
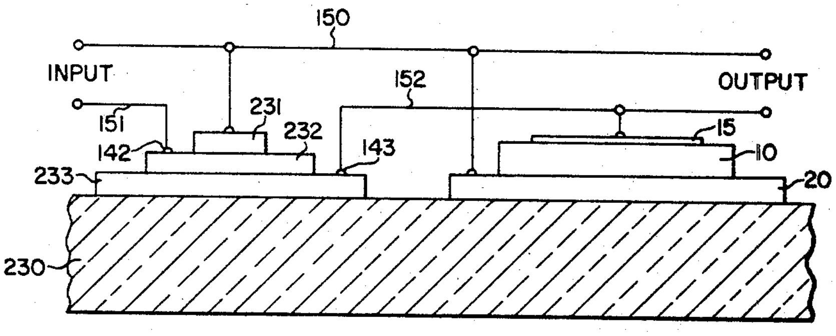
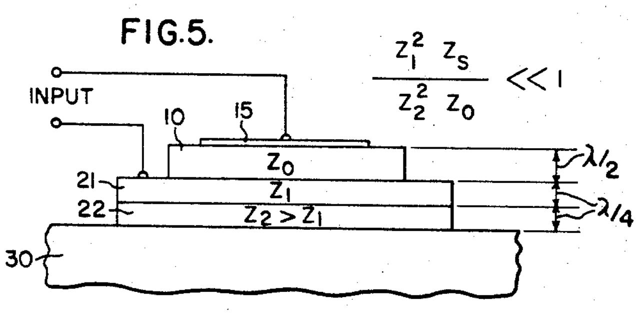
INVENTOR
William E. Newell
BY Gordon H. Telfer
ATTORNEY United States Patent Office 3,414,832
Patented Dec. 3, 1968

3,414,832
ACOUSTICALLY RESONANT DEVICE
William E. Newell, Wilkinsburg, Pa., assignor to Westinghouse Electric Corporation, East Pittsburgh, Pa., a corporation of Pennsylvania
Filed Dec. 4, 1964, Ser. No. 415,913
13 Claims. (Cl. 330—31)

ABSTRACT OF THE DISCLOSURE

A piezoelectric resonator is solidly joined to a solid body of material that may contain or support electronic elements. An interlayer structure having an acoustic impedance different than that of the resonator and that of the body and having an effective thickness to provide acoustic isolation between them is used.

This invention relates generally to devices exhibiting acoustic resonance such as piezoelectric resonators used in combination with amplifiers to give frequency selective properties thereto.

In its more particular aspects the invention relates to means for mounting resonators for microelectronic applications such as with semiconductor integrated circuits and thin film integrated circuits.

Microelectronic tuned amplifiers, including those embodied in semiconductor integrated circuits, thin film integrated circuits and hybrid integrated circuits, heretofore required the use of a separate LC tank circuit or piezoelectric resonator that undesirably adds to the size and cost and reduces the reliability that could otherwise be obtained.

Several different approaches for fabricating a completely integrated tuned amplifier have been previously proposed including thin-film inductors formed on or within the integrated circuit, active feedback networks provided by the use of phase shifters, for example, parallel T or distributed RC circuits or delay lines in the feedback path of the amplifier, or through the use of various negative resistance devices that present an inductive impedance such as a unijunction transistor. None of these or other various proposals prior to this invention have been completely satisfactory even when the problem is limited to that of providing a simple, high Q, fixed frequency bandpass response at high frequencies. In this context high Q may be considered to be anything greater than 50 and high frequency at least one magacycle. It will be appreciated that difficulties encountered are more severe where other characteristics are desired such as variable tuning.

While it may yet be possible to adequately provide an inductive element in thin film form such as by use of a ferrite thin film or otherwise to provide the desired function it is still the case that a solution clearly having the desired features of small size, low cost and stability in performance has not yet been presented for this microelectronic problem.

Piezoelectric resonators of quartz or other materials are well known for use as tuning elements. They have not, however, been wholly satisfactory with completely integrated circuits for several reasons. First, rather fragile and bulky mounts have been required to isolate the acoustic vibrations, thus precluding integration of the resonator. Secondly, the upper frequency has been limited by the fragility of the resonator itself. Thirdly, the response of thickness resonators, which are the only practical type above a few megacycles, is often irregular because of spurious lateral modes of resonance.

It is, therefore, an object of this invention to provide improved means for mounting acoustically resonant devices particularly for microelectronic applications.

Another object is to provide a microelectronic tuned amplifier not requiring separate tuning elements.

Another object is to provide a high Q tuning element exhibiting good stability that can be disposed in a unitary structure with an integrated circuit.

Another object is to provide an acoustically resonant device not requiring a fragile or bulky mount, whose upper frequency is not limited by the fragility of the resonator and that suppresses spurious lateral modes of resonance.

The invention, in brief, achieves the above-mentioned and additional objects and advantages in providing a piezoelectric resonator solidly mounted directly to, but acoustically isolated from, a substrate. The substrate may be, as examples, a silicon chip containing an integrated semiconductor amplifier or a ceramic substrate on which thin film amplifier elements are disposed. The solid mounting is made possible by providing an interlayer structure between the resonator and the substrate to avoid coupling acoustic energy from the resonator into the substrate. The interlayer structure is selected so as to provide a large mismatch between the acoustic impedances at the mounted surface of the resonator and includes one or more quarter wavelength layers of materials of selected acoustic impedance.

The present invention, together with the above-mentioned and additional objects and advantages thereof will be better understood by referring to the following description together with the accompanying drawing, wherein:

FIGURE 1 is a side elevation of general representation of a structure in accordance with the present invention;

FIG. 2 is an electrical circuit schematic diagram of elements that may suitably be joined in accordance with the principles of the present invention;

FIG. 3 is a partial sectional view of a semiconductor integrated circuit including a transistor amplifier that is electrically coupled to a piezoelectric resonator solidly mounted to the integrated circuit but acoustically isolated therefrom in accordance with the principles of this invention;

FIG. 4 is a partial sectional view of a thin film integrated circuit including an active amplifier element and a piezoelectric resonator electrically coupled thereto but acoustically isolated therefrom in accordance with the principles of the present invention; and FIG. 5 is a general view of embodiments in accordance with the present invention to assist in an explanation of the principles thereof.

FIG. 1 shows the general features of acoustically resonant devices in accordance with the present invention including a piezoelectric resonator 10, a substrate 30 and an interlayer structure 20 disposed between the resonator and the substrate and solidly joining them together while providing an acoustic mismatch therebetween. The interlayer structure 20 is required because the acoustic impedances of substrates and resonators of practical interest are too similar to provide an effective mismatch.

The piezoelectric resonator 10 may be of known types of material in which an applied electrical time varying signal sets up a mechanical vibration. Proper selection of the dimensions of the resonator leads to mechanical resonance affecting the electrical terminal impedance. Depending on the geometry and orientation of the piezoelectric material, different modes of resonance may be excited. However, the illustrative embodiments discussed below are concerned primarily with the thickness mode for longitudinal waves although other modes of resonance are included within the scope of the broader aspects of the present invention. Use of one of the various other possible modes of resonance, may, of course, require a change in the resonator dimensions and electrode configuration from that shown and described herein. Suitable piezoelectric materials include, but are not limited to, quartz, cadmium sulfide and polarized ferroelectric materials such as lead-zirconate-titanate.

The substrate 30 may in general be any solid body including one to which electrical coupling of the resonator 10 is not of interest. However, the principal purposes of the present invention in providing a tuned amplifier without an external tuning element are achieved with a substrate including, either within the material of which it is principally comprised or disposed on the surface thereof, a solid state amplifier element to which the resonator 10 is electrically coupled as will be described more fully below.

The interlayer structure 20 comprises one or more layers of material of suitable thickness and having acoustic impedances so as to provide a substantial acoustic mismatch between the resonator and the rest of the structure permitting the formation of a structure with amplifier and tuning elements physically united. Fuller description of the nature and selection of the interlayer structure will be found below following descriptions of particular embodiments within the scope of the invention.

FIG. 2 illustrates in schematic form elements it would be desirable to unite or integrate within a unitary structure. These include a transistor amplifier T and a tuning element. Conventional circuitry for applying the necessary DC biases to the transistor is not shown for increased simplicity and clarity. In this illustration the transistor T is shown in the conventional common emitter configuration, the output of the transistor being coupled to the tuning element. The tuning element provides frequency selectivity in the amplification of transistor T such as is desired, for example, in the intermediate frequency amplifier stages of a superheterodyne radio receiver.

FIG. 3 shows one embodiment of the invention wherein the resonator 10 is solidly mounted by means of interlayer 20 to a substrate 130 that is a semiconductor integrated circuit, of which only part is shown, that includes a transistor structure including an emitter region 131, a base region 132 and collector region 133 with ohmic contacts 41, 42 and 43 applied to the respective regions. The electrical coupling between the amplifier and the resonator is illustrated by the conductors, of which conductor 51 is an input lead to the base 132 of the transistor, conductor 50 couples the emitter 131 of the transistor to the tuning element and provides input and output terminals, and conductor 52 couples the transistor collector 133 to the otherside of the resonator 10 and also provides an output terminal. Thus, in the structure of FIG. 3 the elements of FIG. 2 are physically integrated in a manner such that the disadvantages of prior art proposals for integrating tuning elements are avoided. Namely, this type of tuning avoids the stability problem encountered in frequency selective active feedback networks, and, furthermore, the factors of cost and reliability provided by the present structure are advantageous compared with previous proposals.

It is to be understood, of course, that the integrated circuit 130 may include many additional elements in addition to those of the amplifier shown. It is also to be noted that where desired the substrate may comprise solely a single transistor solidly mounted to the resonator 10. In the latter instance, the substrate structure may be that of a conventional transistor and the region 134 that is provided in an integrated circuit structure principally for electrical isolation between elements of the integrated circuit need not be employed. In this embodiment, as well as that to be described next, it is assumed that the interlayer structure 20 includes one of the electrodes for the piezoelectric resonator 10 while the unmounted resonator surface has an electrode 15 thereon.

Copending application Ser. No. 289,216, now Patent No. 3,271,685 filed June 20, 1963, by J. D. Husher and J. McClain and assigned to the assignee of the present invention, now Patent 3,271,685, issued Sept. 6, 1966, should be referred to for a fuller description of examples of semiconductor integrated circuits for which tuning elements can advantageously be provided in accordance with the present invention.

FIG. 4 illustrates another embodiment where the piezoelectric resonator 10 is solidly mounted to a substrate 230 that is an insulating member such as a ceramic, carrying an attached transistor including the layers 231, 232 and 233 with electrodes 141, 142 and 143, respectively. Here the nature of the electrical coupling by means of the conductors 150, 151 and 152 is like that discussed in connection with FIG. 3.

The two embodiments of FIG. 3 and FIG. 4 are merely representative of potential applications of the present invention. Naturally, it is not essential that the resonator and the amplifier be disposed on the same surface of the substrate 130 or 230 in order to achieve the desired acoustic relationship therebetween. Furthermore, provision of the conductors 150, 151 and 152 need not be in the form of lead wires as illustrated, but may and preferably will take the form of thin film conductors, such as may be formed of evaporated material, passing over portions of the integrated structure and insulated where necessary by a film of insulating material.

The amplifiers illustrated in FIGS. 3 and 4 are, of course, merely by way of example. In addition to other bipolar transistor configurations that are possible, the amplifier may be a field effect transistor of known configuration. As a further example, a thin film transistor may be formed on a ceramic substrate by deposition, such as by evaporation, of a layer of cadmium sulfide to which source and drain electrodes are applied directly with an insulated gate electrode disposed between the source and drain. Advantageously, if the necessary degree of crystallinity of the cadmium sulfide is achieved, a layer may be formed elsewhere on the substrate at the same time for use as the resonator.

Further applications of solidly mounted resonators in accordance with the present invention are possible. A tuner, such as for television, may be provided by positioning a plurality of resonators of selected resonant frequencies on a substrate and providing means for selectively electrically interconnecting any resonator to amplifier stages.

Additionally, a plurality of suitably designed resonators, possibly disposed on a single interlayer structure and substrate, can be electrically interconnected in ways well known in the art to provide a more precise filter characteristic than is possible with a single resonant element.

It will of course be understood that the acoustic isolation achieved by the interlayer structure at the desired resonant frequency is not equally effective at other frequencies, thereby serving to suppress spurious modes of resonance by coupling the energy of such spurious modes into the substrate.

In the prior art, resonators for high frequencies were necessarily operated in an overtone mode because fundamental mode resonators would be too thin to be fabricated by practical techniques. In accordance with this invention, deposition of a thin film of piezoelectric material on a solid substrate in accordance with this invention permits high frequency resonance in the fundamental mode. For example, at 150 megacycles the fundamental mode in commercial lead-zirconate-titanate requires that the resonator be about 0.5 mils thick. Without solid mounting such a thin resonator is not practical.

As previously stated the interlayer structure 20 comprises one or more layers of materials to provide the acoustic mismatch desired. The number of layers in the interlayer structure is determined by the degree of acoustic isolation desired, which depends on the required Q and on the acoustic properties of the interlayer materials, as will be explained. However, it is the case that in all embodiments of the present invention it is necessary that the one or more layers within the interlayer structure have an effective thickness of ¼ of an acoustic wavelength at the acoustic resonant frequency of the resonator and also that they have an acoustic impedance of a value so that the quantity $Z_x/Z_o$, where $Z_x$ is the acoustic impedance seen by the resonator and $Z_o$ is the acoustic impedance of the resonator, is substantialy different than unity because if that quantity is close to unity substantial acoustic energy is coupled into the substrate and lost. While it is the case that the Q of the resonator will be higher where the quantity $Z_x/Z_o$ is farther from unity, it appears that essentially all practical embodiments of the invention will be in instances in which this quantity is at least an order of magnitude either greater than or less than one.

It is to be understood that the term "effective thickness" is used herein to indicate that a specified thickness of an element may vary by an odd, integral multiple without essential change in acoustic properties. For example, the effective thickness of the layers of material in the interlayer structure is to be ¼ of a wavelength but they can each be any odd number of quarter wavelengths.

This flexibility in the choice of the interlayer thicknesses can also be used, if needed, to further suppress spurious resonant modes.

In the fabrication of structures in accordnace with the present invention careful control of resonator and interlayer thickness will usualy be required for high Q at a specified frequency. However, if the interlayer structure varies from the designed thickness, it is possible to achieve high Q resonance at the intended frequency by a compensating change in resonator thickness. A convenient fabrication operation for high Q structures would be one in which the resonator is formed of material deposited from a vapor with means to continuously, or periodically, monitor the resonance of the structure so that deposition is carried to the point of optimum thickness and no farther. Additionally, where the interlayer structure comprises more than one layer of material, offsetting variations in design thickness may still result in high Q resonance at the desired frequency. All such variations of interlayer and resonator thickness that provide the desired acoustic isolation between resonator and substrate at the desired resonant frequency are, of course, within the scope of the present invention. While there is no precise limit, the thicknesses specified in this description and the appended claims are to be read with the understanding that a variation of approximately 5% may be permitted.

The acoustic impedance of the various materials employed in the structure is important both in the understanding of and the practice of the present invention. Acoustic impedance represents a quantity describing the degree to which a material resists mechanical displacement, or more exactly, the ratio of pressure to particle velocity resulting from the propagation of an acoustic wave. Acoustic impedance may be variously defined for various purposes. It is of principal interest in the present context, where the primary concern is with longitudinal waves, to use in selecting materials the longitudinal impedance that may be defined as:

$$Z=\sqrt{\rho(\lambda+Z\mu)}$$

where $\rho$=density of the material
$\lambda$=the Lamé constant of material
$\mu$=the shear modulus of the material.

As so defined, Z is in units of kg./sec.-m.². The magnitude of the impedance need not be exactly known for the understanding or practice of the present invention. It is the magnitude of difference in the impedances of the resonator, substrate and materials of the interlayers that is important. In the examples discussed below, the values of acoustic impedance are taken from Physical Acoustics and the Properties of Solids by W. P. Mason (D. Van Nostrand Co., Princeton, N.J.; 1958).

If it is desired to provide a structure with a single interlayer, the interlayer should have an acoustic impedance substantially different from that of both the resonator and substrate. If it is desired to use a silicon substrate, for example, an integrated circuit in silicon, (acoustic impedance $Z_s$ equalling $19.6\times10^6$ units) with a piezoelectric resonator designated PZT–4, a lead zirconate titanate material sold under that trademark by Clevite Bruch Company (acoustic impedance $Z_o=29.6\times10^6$ units), it would be desirable to employ as the interlayer a material having low acoustic impedance such as polyethylene which has an acoustic impedance $Z_1$ of $1.75\times10^6$ units. Therefore $$\frac{Z_x}{Z_o}=\frac{Z_1^2}{Z_sZ_o}=5.28\times10^{-3}$$

and sufficient acoustic mismatch can be provided.

In the design of a 10.7 megacycle IF amplifier for an FM receiver, the polyethylene interlayer should have an effective thickness of one-quarter of the ratio of acoustic velocity to frequency, or about 1.8 mils, or an odd multiple thereof. (In the calculations herein to find proper layer thickness, the acoustic velocity for the given materials are also taken from Physical Acoustics and the Properties of Solids by W. P. Mason.)

Since polyethylene has a lower acoustic impedance than lead-zirconate-titanate, the resonator should have an effective thickness of one-half wavelength. At 10.7 megacycles a half wavelength in PZT–4 material is 7.3 mils.

If a single layer of material is used in the interlayer structure having an acoustic impedance greater than that of the resonator material, a resonator effective thickness that is one-quarter wavelength is required. For example, using tungsten as the interlayer material (having an acoustic impedance of $103\times10^6$ units) instead of polyethylene in the above example, at the resonant frequency, $$\frac{Z_x}{Z_o}=\frac{Z_1^2}{Z_sZ_o}=18.3$$

shows the degree of acoustic mismatch that can be achieved. In the design of a 10.7 megacycle IF amplifier for an FM receiver the tungsten interlayer should have a thickness of about 5 mils or an odd multiple thereof. For a ¼ wavelength PZT–4 resonator the thickness should be about 3.6 mils. FIG. 5 shows an alternate configuration employing two interlayers 21 and 22 between the resonator 10 and the substrate 30. The value of employing two interlayers is to further enhance the quantity $Z_x/Z_o$ as will be apparent from the following example that requires only metal interlayers:

Substrate 30; silicon; $Z_s=19.6\times10^6$ units
Resonator 10; PZT–4; $Z_o=29.6\times10^6$ units
Layer 21; magnesium; $Z_1=10\times10^6$ units
Layer 22; tungsten; $Z_2=103\times10^6$ units $$\frac{Z_x}{Z_o}=\frac{Z_1^2}{Z_2^2}\frac{Z_s}{Z_o}=6.24\times10^{-3}$$

The calculated mechanical Q for such a structure in the fundamental mode of resonance, is approximately 250.

In the discussion herein, the calculated Q value is determined with the assumptions that the substrate is infinitely thick and the unbound resonator face is perfectly free. Actual values will, therefore, be somewhat less.

It can be readily shown that successive interlayers of alternate high and low acoustic impedance would still further enhance the Q of the device. For example a higher Q could be achieved by employing as the interlayers alternate layers of a very low acoustic impedance material such as a plastic since polyethylene has an acoustic impedance of $1.75\times10^6$ units. Such materials as polytetrafluoroethylene, sold under the trademark Teflon, may also be desirable alternately disposed with a high acoustic impedance material such as tungsten, gold or platinum. Also suitable and perhaps more readily fabricated in an interlayer structure consisting of alternate layers of glass, having an acoustic impedance of about $13\times10^6$ units, and a high acoustic impedance metal.

The effectiveness of an interlayer structure as described to provide solid mounting and acoustic isolation between a resonator and a substrate has been verified by the successful making and testing of such a structure.

As a resonator 10, referring again to FIG. 5, a body of PZT–4 lead-zirconate-titanate was used (acoustic impedance of $29.6\times10^6$ units). Magnesium (acoustic impedance of $10\times10^6$ units) and tungsten were used as the layers 21 and 22 of the interlayer structure. The substrate was a ¼ inch thick body of reinforced resinous plastic having an acoustic impedance estimated to be about $3\times10^6$ units.

The mounted resonator structure was formed for resonance at a frequency of 1.78 megacycles. The magneisum and tungsten layers were of commercially available sheet material of 32 mils and 30 mils thickness respectively equal to one-quarter wavelength at 1.78 mc. Pieces of these materials ¾ inch square were cut and polished until smooth. The PZT–4 disk was sanded from an original thickness of 100 mils to a thickness of 45 mils, equal to one-half wavelength at 1.78 mc.

The interlayers were secured between the substrate and resonator by a bonding material of a mixture of beeswax and rosin used sparingly so as to have a minimum effect on the acoustic properties of the structure. This bonding material was chosen to permit easy assembly and disassembly of the structure by heating, and not as a commercially practical material for use in a permanent structure. The magnesium layer was disposed adjacent the resonator and the tungsten layer adjacent the substrate.

The structure was connected within a test circuit that applied signals at various frequencies from 0 to 10 megacycles and the resonator response viewed on an oscilloscope. From the frequency response the anticipated thickness mode resonace peak could be clearly seen between 1.75 mc. and 2.0 mc. with a measured Q of about 100.

Not only was a relatively sharp resonance peak found at the desired frequency, indicating success in acoustically isolating the resonator and substrate, but the response was relatively free of radial overtones and spurious thickness resonance peaks compared with the response of the unattached resonator. Also, the response was observed with the resonator mounted on the substrate without an interlayer structure. Resonance was effectively destroyed due to the lack of isolation between the elements.

Successful solidly mounted resonators have also been made, using quarter wavelength layers magnesium and tungsten in the interlayer structure, on substrates of brass and in other instances, of Kovar alloy (an alloy principally of iron, nickel and cobalt) with dimensions selected to achieve resonance at 7 mc. In some instances gold was used in place of tungsten. As bonding materials, commercial epoxy resin cements such as that available from The Fluorocarbon Co. under the trade name Fluorocarbon Thermo-Blend Epoxy Paste and commercial indium solders such as that available from Indium Corporation of America under the trade name Indalloy Solder No. 9 (a composition comprising about 12% by weight indium and the balance substantially of tin and lead) were used. In using an epoxy resin cement, a thin layer was applied at the interfaces and the structure placed under pressure while curing the resin at elevated temperature. In instances in which an indium solder was used it was applied such as by ultrasonic tinning and the bonds formed by applying pressure and heat.

For an optimum structure, the bonding material holding the layers of the structure together should be carefully chosen. Ideally the bonding material at any particular interface should be specifically chosen in accordance with its position with respect to the acoustic standing wave. For example, referring again to FIG. 5, the bond between the resonator 10 and the first interlayer 21 and the bond between the second interlayer 22 and the substrate 30 lie at regions subjected to minimum stress by the acoustic wave since they are an integral number of half wavelengths from the free face of the resonator. It is desirable, for maximum Q, to form relatively "free bonds" at these interfaces. On the other hand, at the bond between interlayers 21 and 22, stress due to the acoustic wave is a maximum and maximum Q is achieved by rigid clamping at such a bond. In general, therefore, the effects of the bonds on the resonant frequency can be minimized by using a bonding material of lowest possible acoustic impedance for the free bonds and of highest possible acoustic impedance for the clamped bonds.

Among the low acoustic impedance materials that might be used for forming free bonds are epoxy resin cements and also, indium solders (consisting essentially of indium with one or more of the metals tin, silver and lead).

For the clamped bonds, materials having a high acoustic impedance include the metals gold and platinum.

However, for high resonant frequencies the selection of appropriate bonding materials can be avoided by forming the required thin film interlayers and resonator by sputtering or vacuum evaporation, choosing materials and techniques such that adequate adhesion is secured directly between layers.

While the present invention has been shown and described in a few forms only it will be apparent that various changes and modifications may be made without departing from the spirit and scope thereof.

What is claimed is:

1. In combination: a piezoelectric resonator; a solid body of material; an interlayer structure solidly joining said resonator and said body having an acoustic impedance different than said resonator and said body and having an effective thickness to provide substantial acoustic isolation between said resonator and said body while permitting said resonator to resonate.

2. A combination as defined in claim 1 wherein: said solid body is an integrated circuit and said resonator is electrically coupled to said integrated circuit and gives frequency selective properties thereo.

3. Electronic apparatus comprising: an integrated circuit including at least a transistor for amplification; a piezoelectric resonator solidly mounted to said integrated circuit but substantially acoustically isolated therefrom by at least one layer of material having a different acoustic impedance than said integrated circuit and said resonator, said layer having an effective thickness of one-quarter of an acoustic wavelength at the resonant frequency of said resonator; said resonator being electrically coupled to said integrated circuit to provide frequency selectivity for said amplifier.

4. Electronic apparatus in accordance with claim 3 wherein: a plurality of layers acoustically isolate said integrated circuit, one having an acoustic impedance less than that of said resonator and integrated circuit, a second having an acoustic impedance greater than that of said resonator and integrated circuit and each having an effective thickness of one-quarter of an acoustic wavelength at the resonant frequency of said resonator.

5. Frequency selective electronic apparatus comprising: a substrate; a piezoelectric resonator; said resonator being solidly mounted to said substrate with an interlayer structure therebetween having an acoustic impedance and thickness providing substantial acoustical mismatch between said substrate and said resonator.

6. Frequency selective electronic apparatus in accordance with claim 5 wherein: said substrate is a body of semiconductive material including elements of an amplifier with said resonator being electrically coupled thereto to provide frequency selectivity.

7. Frequency selective electronic apparatus in accordance with claim 5 wherein: said substrate is a body of insulator material having elements of an amplifier on the surface thereof with said resonator being electrically coupled thereto to provide frequency selectivity.

8. A solidly mounted acoustically resonant device comprising: a piezoelectric resonator; a substrate; an interlayer structure joining said resonator and said substrate, said interlayer structure comprising at least one layer of material having an effective thickness of one-fourth of an acoustic wavelength at the acoustic resonant frequency of said resonator and also having an acoustic impedance of a value so the quantity $Z_x/Z_o$, where $Z_x$ is the acoustic impedance seen by the resonator and $Z_o$ is the acoustic impedance of the resonator, is at least an order of magnitude from one.

9. A solidly mounted acoustically resonant device in accordance with claim 8 wherein: said interlayer structure comprises a single layer of material having an acoustic impedance $Z_1$ of a value so the quantity $Z_1^2/Z_sZ_o$, where $Z_s$ and $Z_o$ are, respectively, the acoustic impedance of said substrate and the acoustic impedance of said resonator, is at least an order of magnitude from one.

10. A solidly mounted acoustically resonant device in accordance with claim 8 wherein: said interlayer structure comprises first and second layers of material having acoustic impedances $Z_1$ and $Z_2$, respectively, with said first layer being adjacent said resonator and said second layer being adjacent said substrate so the quantity $Z_1^2Z_s/Z_2^2Z_o$, where $Z_s$ and $Z_o$ are, respectively, the acoustic impedance of said substrate and the acoustic impedance of said resonator, is at least an order of magnitude from one.

11. A solidly mounted acoustically resonant device in accordance with claim 8 wherein: said interlayer structure comprises *n* layers, where *n* is an integer greater than one, the odd numbered ones of said *n* layers starting from said resonator, having an acoustic impedance that is appreciably different than that of the next adjacent even numbered ones of said *n* layers so that the ratio $Z_x/Z_o$ is at least an order of magnitude from one.

12. A solidly mounted acoustically resonant device in accordance with claim 8 wherein: said substrate includes a solid state amplifier element; means to electrically couple said resonator and said amplifier element to provide tuning.

13. A solidly mounted acoustically resonant device in accordance with claim 8 wherein: said resonator has an effective thickness between its two surfaces of one half of an acoustic wavelength at its acoustic resonant frequency with means for making electrical contact to said two surfaces for providing operation in a thickness mode.

References Cited

UNITED STATES PATENTS 3,287,506 11/1966 Hähnlein.

ROY LAKE, *Primary Examiner.*

J. B. MULLINS, *Assistant Examiner.*